United States Patent
Tuominen et al.

(10) Patent No.: US 11,291,119 B2
(45) Date of Patent: Mar. 29, 2022

(54) SEMI-FLEX COMPONENT CARRIER WITH DIELECTRIC MATERIAL SURROUNDING AN EMBEDDED COMPONENT AND HAVING LOCALLY REDUCED YOUNG MODULUS

(71) Applicant: AT&S (China) Co. Ltd., Shanghai (CN)

(72) Inventors: Mikael Tuominen, Pernio (FI); Nick Xin, Shanghai (CN); Seok Kim Tay, Singapore (SG)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/947,477

(22) Filed: Aug. 3, 2020

(65) Prior Publication Data

US 2021/0045249 A1 Feb. 11, 2021

(30) Foreign Application Priority Data

Aug. 6, 2019 (CN) .......................... 201910721771.2

(51) Int. Cl.
*H05K 1/18* (2006.01)
*H05K 1/02* (2006.01)
(Continued)

(52) U.S. Cl.
CPC ............. *H05K 1/189* (2013.01); *H05K 1/028* (2013.01); *H05K 1/0393* (2013.01); *H05K 1/118* (2013.01); *H05K 3/4691* (2013.01)

(58) Field of Classification Search
CPC ........ H05K 1/182; H05K 1/185; H05K 1/183; H05K 1/184; H05K 1/189; H05K 1/028; H05K 1/0393; H05K 1/118; H05K 3/4691
See application file for complete search history.

(56) References Cited

U.S. PATENT DOCUMENTS 9,743,529 B2 * 8/2017 Lee ..................... H05K 3/4691
10,420,208 B2 * 9/2019 Lester ................... H05K 1/028
(Continued)

FOREIGN PATENT DOCUMENTS

CN 101772261 A 7/2010
CN 202503812 U 10/2012
(Continued)

OTHER PUBLICATIONS

English translation of First Office Action in Application No. 201910721771.2; pp. 1-3; dated Jun. 29, 2021; China National Intellectual Property Administration; No. 6, Xitucheng Lu, Jimenqiao Haidian District, Beijing City, 100088, China.
(Continued)

*Primary Examiner* — Hoa C Nguyen
*Assistant Examiner* — Amol H Patel
(74) *Attorney, Agent, or Firm* — Robert A. Blaha; Smith Tempel Blaha LLC

(57) ABSTRACT

A semi-flex component carrier includes a stack with at least one electrically insulating layer structure and/or at least one electrically conductive layer structure. The stack defines at least one rigid portion and at least one semi-flexible portion, and a component embedded in the at least one rigid portion. The at least one electrically insulating layer structure of the stack has a mechanical buffer structure surrounding at least part of the component and has a lower value of the Young modulus than other electrically insulating material of the stack.

25 Claims, 2 Drawing Sheets

(51) Int. Cl.
*H05K 1/03* (2006.01)
*H05K 1/11* (2006.01)
*H05K 3/46* (2006.01)

(56) References Cited

U.S. PATENT DOCUMENTS

| | | | |
|---|---|---|---|
| 10,431,382 B2* | 10/2019 | Li | H01G 4/224 |
| 2008/0047737 A1* | 2/2008 | Sahara | H05K 3/4691 |
| | | | 174/254 |
| 2014/0268780 A1 | 9/2014 | Wang et al. | |
| 2015/0070864 A1* | 3/2015 | Rainer | H01L 21/563 |
| | | | 361/782 |
| 2015/0282307 A1 | 10/2015 | Shimizu et al. | |
| 2016/0066429 A1* | 3/2016 | Taniguchi | H05K 1/0278 |
| | | | 361/749 |
| 2016/0095207 A1 | 3/2016 | Taniguchi et al. | |
| 2017/0040406 A1* | 2/2017 | Park | H01L 51/56 |
| 2017/0156214 A1* | 6/2017 | Tago | H05K 3/4617 |
| 2017/0171971 A1* | 6/2017 | Lin | H05K 1/056 |
| 2017/0339784 A1* | 11/2017 | Zluc | H05K 1/189 |
| 2019/0141836 A1 | 5/2019 | Gavagnin et al. | |
| 2020/0163203 A1* | 5/2020 | Park | H05K 3/32 |
| 2020/0413544 A1* | 12/2020 | Gao | H01Q 1/2283 |

FOREIGN PATENT DOCUMENTS

| | | |
|---|---|---|
| CN | 205093052 U | 3/2016 |
| CN | 109757025 A | 5/2019 |
| WO | 2016091995 A1 | 6/2016 |

OTHER PUBLICATIONS

First Office Action in Application No. 201910721771.2; pp. 1-9; dated Jun. 29, 2021; China National Intellectual Property Administration; No. 6, Xitucheng Lu, Jimenqiao Haidian District, Beijing City, 100088, China.

* cited by examiner

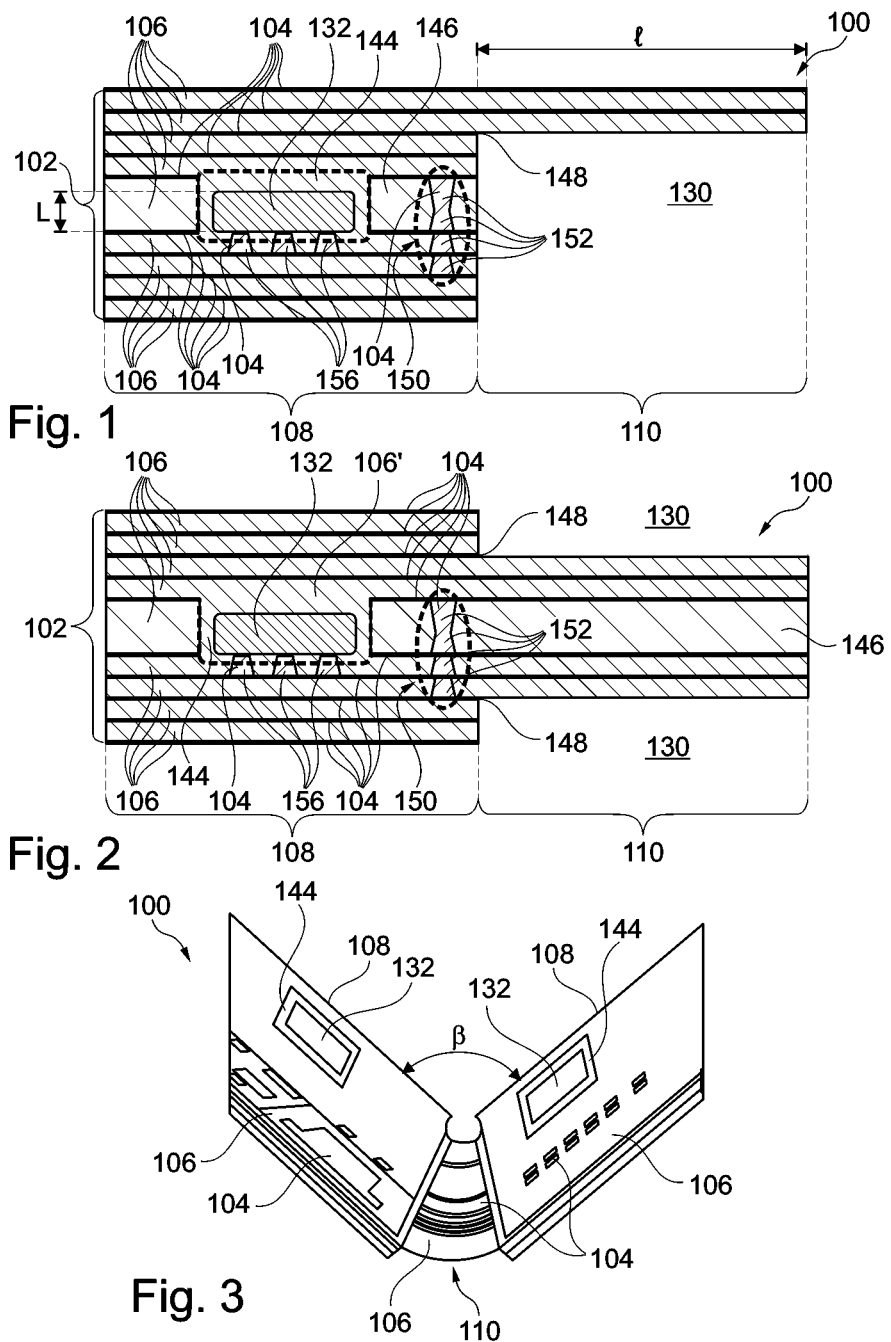

SEMI-FLEX COMPONENT CARRIER WITH DIELECTRIC MATERIAL SURROUNDING AN EMBEDDED COMPONENT AND HAVING LOCALLY REDUCED YOUNG MODULUS

CROSS-REFERENCE TO RELATED APPLICATIONS

The present application claims priority to China Patent Application No. 201910721771.2 filed Aug. 6, 2019, the entire contents of which is incorporated herein by reference in its entirety.

TECHNICAL FIELD

The invention relates to a semi-flex component carrier and a method of manufacturing a semi-flex component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Different types of partially flexible and partially rigid component carriers exist. A "rigid-flex component carrier" comprises a fully flexible portion, for instance made of polyimide, being a different material than stiffer dielectric material of a rigid portion. However, implementing fully flexible materials such as polyimide in a component carrier is cumbersome and involves reliability issues.

Another conventional type of partially flexible and partially rigid component carriers is a "semi-flex component carrier" which is a component carrier in which its semi-flexible portion may comprise the same dielectric (for instance FR4) material as a rigid portion, so that bendability of the semi-flexible portion only results from the reduced thickness in the semi-flexible portion. However, conventional semi-flex component carriers may be prone to damage upon bending a semi-flexible portion thereof.

SUMMARY

There may be a need to provide a partially rigid and partially flexible component carrier with high functionality and high reliability.

According to an exemplary embodiment of the invention, a semi-flex component carrier is provided which comprises a stack (in particular a laminated stack, i.e. a stack in which its layer structures are connected by the application of heat and/or pressure) comprising at least one electrically insulating layer structure (in particular a plurality of electrically insulating layer structures) and/or at least one electrically conductive layer structure (in particular a plurality of electrically conductive layer structures), wherein the stack defines at least one rigid portion and at least one semi-flexible portion, and a component (in particular one or a plurality of components) embedded in the at least one rigid portion, wherein at least one electrically insulating layer structure of the stack comprises a mechanical buffer structure (in particular directly, i.e. without other material in between) surrounding (in particular partially or entirely) at least part of the component and having a lower value of the Young modulus than other (in particular than all other) electrically insulating material of the stack (in particular having a lower value of the Young modulus than electrically insulating material of the stack surrounding, more particularly directly surrounding, the mechanical buffer structure).

According to another exemplary embodiment of the invention, a method of manufacturing a semi-flex component carrier is provided, wherein the method comprises providing (in particular laminating, i.e. connecting by the application of heat and/or pressure) a stack comprising at least one electrically insulating layer structure and/or at least one electrically conductive layer structure, wherein the stack defines at least one rigid portion and at least one semi-flexible portion, and embedding a component in the at least one rigid portion, wherein at least one electrically insulating layer structure of the stack comprises a mechanical buffer structure surrounding at least part of the component and having a lower value of the Young modulus than other electrically insulating material of the stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "rigid portion" may particularly denote a portion of the component carrier which, when applying or exerting ordinary forces typically occurring during operation of the component carrier, the rigid portion will remain substantially undeformed. In other words, the shape of the rigid portion will not be changed when applying forces during operation of the component carrier.

In the context of the present application, the term "semi-flexible portion" may particularly denote a portion of the component carrier which, upon exerting typical forces occurring during operation of the component carrier, may result in a deformation of the semi-flexible portion. The deformation of the semi-flexible portion may be possible to such an extent that the shape of the entire component carrier may be significantly influenced by deforming the semi-flexible portion. However, such a semi-flexible portion may be less flexible than a fully flexible portion (formed, for instance, from polyimide). In particular, such a semi-flexible portion may be a non-polyimide structure.

In the context of the present application, the term "semi-flex component carrier with semi-flexible portion" may particularly denote a component carrier in which its semi-flexible portion may be made, partially or entirely, of the same dielectric and/or metallic material as one or more adjacent rigid portions, but may for instance only have a locally smaller thickness than the connected rigid portion(s).

In such an exemplary configuration, bendability of the semi-flexible portion only results from the reduced thickness rather than from a more flexible material in the flexible portion. In contrast to such a semi-flex component carrier, a rigid-flex component carrier (i.e. another type of partially flexible and partially rigid component carrier) comprises a fully flexible portion, for instance made of polyimide. In such an embodiment, the material of the flexible portion may be different from the material of one or two adjacent rigid portions, and the material of the flexible portion may be specifically selected to have high elasticity or flexibility. For example, it is in particular possible according to exemplary embodiments of the invention to use a material without glass fibers (or other reinforcing particles) and/or a low modulus (or even ultra-low modulus) material on at least one layer (wherein such a material may be used in both the rigid portion and the semi-flexible portion).

In the context of the present application, the term "mechanical buffer structure" may particularly denote a mechanically relatively flexible or elastic electrically insulating structure (in particular directly) surrounding an embedded component in the rigid portion of the semi-flex component carrier. Such a mechanical buffer structure may have a locally reduced value of the Young modulus and may therefore function as a mechanically damping or force balancing structure, for instance in the event of bending stress.

In the context of the present application, the term "Young modulus" may particularly denote the elastic modulus, i.e. a measure of the stiffness of a solid material and defines the relationship between stress (force per unit area) and strain (proportional deformation) in a material. A softer material has a smaller value of the Young modulus than a more rigid material.

According to an exemplary embodiment of the invention, a semi-flex component carrier is provided which comprises a mechanical buffer structure as dielectric material at least in a rigid portion thereof and at least partly encapsulating a component embedded in the rigid portion. Said mechanical buffer structure may have a value of the Young modulus (i.e. a ratio be-tween an expanding force and a spatial expansion) being smaller than that of surrounding electrically insulating material of the stack. Descriptively speaking, such a dielectric material partially or entirely surrounding a component embedded in a rigid portion of a semi-flex component carrier has a higher elasticity than other dielectric material of the stack, for instance made of FR4 material. As a result, the semi-flex component carrier may be less prone to failure (in particular less prone to the formation of cracks or to breakage) in particular in a volume portion corresponding to the embedded component when the semi-flexible portion is bent. Hence, a component carrier configured as a complete package provided in embedding technology may be combined with semi-flex technology. By taking these measures, a semi-flexible (in particular non-polyimide) based component carrier with embedded component and with semi-flex characteristics may be configured to be robust against bending stress.

Thus, an exemplary embodiment of the invention applies a low modulus material selectively around an embedded component of a semi-flex component carrier such as a semi-flex printed circuit board (PCB). As a result, it may be advantageously possible to reliably embed the component mechanically buffered in the rigid portion of the stack and at the same time realize a semi-flex component carrier with a small bending radius. Thus, exemplary embodiments of the invention may make it possible to solve issues with conventional semi-flex applications. In particular, exemplary embodiments of the invention synergistically implement dielectric material with a low Young modulus around the embedded component, i.e. selectively in a region surrounding a component embedded in the rigid portion. The rest of the dielectric material in the rigid portion may be formed by a material having a higher value of the Young modulus, i.e. providing proper stability.

In the following, further exemplary embodiments of the method and the component carrier will be explained.

In an embodiment, the component is exclusively (preferably, but not necessarily directly) surrounded by the mechanical buffer structure and by one or more contact vias electrically contacting the component with respect to the at least one electrically conductive layer structure. In other words, a shell surrounding the component may consist of the mechanical buffer structure and one or more contact vias only. Thus, a proper elastic damping effect and hence a high mechanical reliability may be advantageously combined with a proper electric connectivity and thus a high electric reliability.

In an embodiment, the component and/or at least part of said mechanical buffer structure is located in a core of the stack. Such a core may be made of a fully cured material such as FR4, optionally covered with a copper foil on one or both of two opposing main surfaces. Dielectric material of such a fully cured core will not re-melt or become flowable upon lamination and can therefore provide strong mechanical support during build-up and during operation. The core may be arranged in the vertically central region of the component carrier. Integrating the component in such a core and encapsulating at least part of the component with the mechanical buffer structure of elastic dielectric material may reliably protect the component from bending stress during operation of the semi-flex component carrier.

In an embodiment, said mechanical buffer structure belongs to and is made of the same material as an electrically insulating layer structure which extends from the at least one rigid portion up to the at least one semi-flexible portion. Thus, the mechanical buffer function of the mechanical buffer structure can be spatially extended from an embedding region up to the semi-flexible portion of the semi-flex component carrier. By taking this measure, it has turned out that the robustness of the component carrier against bending stress may be further increased. At the same time, the presence of the mechanical buffer structure also in the at least one semi-flexible portion may increase its flexibility.

In another embodiment, said mechanical buffer structure extends exclusively within the at least one rigid portion. In such an advantageous embodiment, the impact of the mechanical buffer structure on the stack is advantageously low.

In an embodiment, the Young modulus of said mechanical buffer structure is smaller than 10 GPa, in particular smaller than 5 GPa, more particularly smaller than 1 GPa (each of said values in particular at a temperature of 300° C.). Such low values of the Young modulus may have a positive impact on the protection of the component against bending stress.

In an embodiment, a coefficient of thermal expansion (CTE) of said mechanical buffer structure is less than 150 ppm/K, in particular less than 100 ppm/K, more particularly less than 70 ppm/K (each of said values in particular at a temperature of 300° C.). It has turned out that in particular the combination of a low Young modulus (in particular less than 5 GPa) and a high elongation (in particular more than 3%) with said sufficiently low CTE values provides excellent properties of the mechanical buffer structure for protecting the embedded component in the semi-flex component carrier.

In an embodiment, said mechanical buffer structure has an elongation of larger than 3%, in particular larger than 4%, more particularly larger than 5%, preferably larger than 10% (each of said values in particular at a temperature of 300° C.). In the context of the present application, the term "elongation", "percent elongation" or "percentage elongation" may particularly denote a remaining elongation of a body after breakage in relation to its initial length. Percent elongation may be a measurement that captures the amount a material will plastically and/or elastically deform up to fracture. Percent elongation is one way to measure and quantify ductility of a material. The material's final length may be compared with its original length to determine the percent elongation and the material's ductility. To calculate percent elongation, the original length of a gauge span may be subtracted from the final length. Then the result from that subtraction may be divided by the original length and multiplied by 100 to obtain the percent elongation. The equation is: elongation=100×[(final length−initial length)/initial length]. Elongation is hence indicative of the ductility of a material. A material with a higher elongation is a more ductile material, while a material with a lower percentage will be more brittle. For instance, FR4 may have an elongation of about 1-2%. In particular, the dielectric material of the mechanical buffer structure may have a combination of a low Young modulus (for instance of less than 5 GPa) and a high elongation (for example an elongation, i.e. a relative length expansion at a point of failure, of more than 3%). Descriptively speaking, such a dielectric material in a rigid portion of a semi-flex component carrier and surrounding an embedded component has a higher elasticity and is more ductile than conventional FR4 material. As a result, the semi-flex component carrier and in particular its embedded component may be less prone to failure (in particular less prone to the formation of cracks or to breakage) when the semi-flexible portion is bent.

Furthermore, said material preferably has an elongation of less than 20% (in particular at a temperature of 300 K) in order to prevent excessive flexibility or bendability of the rigid portion (in which said dielectric layer may be located). An excessive elongation might deteriorate the mechanical stability of the component carrier as a whole.

In an embodiment, a vertical extension range of the component does not encompass a vertical level of one or more bending points between the at least one rigid portion and the at least one semi-flexible portion. By arranging the embedded component at a vertical height different from a vertical position of a bending between the semi-flexible portion and the rigid portion, the robustness of the embedded component encapsulated in the mechanical buffer structure can be further increased.

In an embodiment, the component carrier comprises a stress propagation inhibiting barrier (in particular comprising or consisting of a plurality of stacked vias filled at least partially with electrically conductive material) in an interface region between the at least one rigid region and the at least one semi-flexible portion and configured for inhibiting stress propagation from the at least one semi-flexible portion to the component. Descriptively speaking, the mentioned stress propagation inhibiting barrier may be arranged to traverse a stress propagation trajectory from a bending point to the embedded component and may thus function for preventing propagation of stress from the semi-flexible portion up to the embedded component during bending of the semi-flex component carrier. Synergistically with the encapsulation of the component with the mechanical barrier structure, such a stress propagation inhibiting mechanism preventing bending stress to reach the component has turned out as an efficient mechanism for protecting the component.

In an embodiment, the at least one semi-flexible portion has a smaller number of layer structures than the at least one rigid portion so that at least one layer structure of the at least one rigid portion is missing in the at least one semi-flexible portion on a top side and/or on a bottom side of the stack in the at least one rigid portion. Thus, the one or more missing layers may be on top of the stack, on bottom of the stack (see FIG. 1) or both on bottom and on top of the stack (see FIG. 2). The mere thickness reduction in the at least one semi-flexible portion, rather than a more flexible dielectric material in the semi-flexible portion compared to the rigid portion, may hence provide the semi-flexible properties of said semi-flexible portion.

In an embodiment, a transition region between the at least one semi-flexible portion and the at least one rigid portion has a slanted sidewall. A slanted sidewall at a bending position has turned out to reduce stress propagation within the component carrier.

In an embodiment, at least one of the at least one electrically insulating layer structure is shared between an embedding area of the component and the at least one semi-flexible portion. As a result, a component carrier with high mechanical integrity, also between semi-flexible portion and rigid portion, may be obtained.

In an embodiment, a density, in particular a number per volume, of vertical through-connections, in particular copper-filled laser vias, surrounding the embedded component is at least 10 vias in a volume surrounding the component having dimensions of 20 mm in all three spatial directions. Such a high density of vias may also contribute to the protection of the embedded component against damage as a result of bending stress.

In an embodiment, the component is embedded between a top electrically insulating layer structure and a bottom electrically insulating layer structure as well as within a further electrically insulating layer structure, wherein all three electrically insulating layer structures extend up to the at least one semi-flexible portion. One or more of said electrically insulating layer structures may be made of a low Young modulus and high elongation as well as low CTE material so as to protect the embedded component. One or more of said electrically insulating layer structures may be made of a higher Young modulus and lower elongation as well as higher CTE material so as to provide stability.

In an embodiment, the mechanical buffer structure comprises or consists of a resin, in particular an epoxy resin. In particular, a proper selection of the base resin and/or one or more additives may allow to adjust the properties of said dielectric layer in terms of elasticity/Young modulus and ductility/elongation.

In an embodiment, the mechanical buffer structure comprises epoxy derivatives, in particular Ajinomoto Build-up Film®. Ajinomoto Build-up Film is a registered trademark of the Ajinomoto Co. Inc. of Tokyo, Japan. Such a material may be a suitable choice to provide the above-described properties in terms of low Young modulus and high elongation.

In an embodiment, the mechanical buffer structure is free of glass cloth. The omission of glass fibers, glass spheres or any other reinforcing particles in a resin matrix of the at least one electrically insulating layer structure with low Young modulus and high elongation may promote the obtainable high elasticity and high ductility.

In an embodiment, the mechanical buffer structure extends over the (in particular entire) at least one semi-flexible portion and over the (in particular entire) at least one rigid portion. In other words, said dielectric layer with low Young modulus and high elongation may be shared between the semi-flexible portion(s) and the rigid portion(s) of the component carrier. Forming said dielectric layer with low Young modulus and high elongation over both the semi-flexible portion and the at least one rigid portion may prevent mechanical weak points at one or more material interfaces between the semi-flexible portion and one or more rigid portions. Such material interfaces may result from different materials of the dielectric in said portions and can be avoided by extending at least one continuous homogeneous dielectric layer with low Young modulus and high elongation extending over the entire horizontal expansion of the component carrier. Such a homogeneous dielectric layer may also be advantageous to suppress CTE (coefficient of thermal expansion) mismatch.

In an embodiment, all of the layer structures of the semi-flexible portion also extend along the at least one rigid portion. Highly advantageously, both the electrically conductive layer structures (in particular made of copper) as well as the electrically insulating layer structures (for instance comprising prepreg, FR4 and/or a material with low Young modulus and high elongation) of the semi-flexible portion may also extend into the one or more connected rigid portions. This ensures a high homogeneity and a high mechanical robustness of the component carrier as a whole. In particular, all of the layer structures are made of the same material and/or have the same thickness in the semi-flexible portion and in the at least one rigid portion. By taking this measure, the homogeneity of the semi-flexible portion and the connected regions of the one or more rigid portions may be further enhanced.

In an embodiment, the component carrier has a semi-flexible portion between two opposing rigid portions. Alternatively, it is however also possible that the semi-flexible portion is connected at one side to a rigid portion, whereas its opposing other side is unconnected.

In an embodiment, the at least one semi-flexible portion has a smaller number of layer structures and/or has a smaller thickness than the at least one rigid portion. Correspondingly, a cavity may be formed above and/or below the semi-flexible portion corresponding to layer structures of the connected rigid portion which are lacking in the semi-flexible portion.

In an embodiment, the mechanical buffer structure comprises a polymer having a flexible segment between a reactive segment and a hard segment. In particular, the hard segment may have a high temperature resistance, the flexible segment may show low warpage and relaxation on internal stress, and/or the reactive segment may be configured for reacting with epoxy resin. Descriptively speaking, the hard segment may have a high temperature resistance. The reactive segment may be capable of reacting with epoxy resin, for instance by cross-linking and/or by the formation of chemical bonds. The flexible segment in between may function as a flexible binder showing a low warpage and promoting relaxation on internal stress. By using such a polymer for the mechanical buffer structure with low Young modulus and high elongation, the proper bendability and high mechanical stability of the component carrier may be further improved.

In an embodiment, one, some or all of the electrically insulating layer structures of the stack being different from said mechanical buffer structure has/have a value of the Young modulus of more than 20 GPa, in particular of more than 30 GPa. Additionally or alternatively, one, some or all of the electrically insulating layer structures of the stack being different from said mechanical buffer structure may be made of prepreg or FR4. Further additionally or alternatively, one, some or all of the electrically insulating layer structures of the stack being different from said mechanical buffer structure may have an elongation in a range from 1% to 2%. In other words, the rest of the dielectric material of the stack which does not belong to the mechanical buffer structure may be made of ordinary PCB (printed circuit board) dielectric material, such as an epoxy resin with reinforcing glass fibers. Thus, the stack of the component carrier may be manufactured with low effort, and only selectively the region surrounding the component is rendered locally elastic and ductile by providing the mechanical buffer structure having the above-described properties.

In an embodiment, the semi-flexible portion has a horizontal length of at least 1 mm. By fulfilling this design rule, bendability of the semi-flexible portion may be further increased while keeping the risk of crack formation or the like during bending small.

In an embodiment, at least one of the at least one electrically insulating layer structure forming at least part of the semi-flexible portion is bent about a bending angle in a range between 0° in 180°. For instance, bending may occur with a bending angle in a range between 60° and 160° without the risk of failure.

In an embodiment, at least one further component may be embedded in the semi-flexible portion of the component carrier. Additionally or alternatively, at least one component may be surface mounted on the partially flexible and partially rigid component carrier, in particular on a rigid portion thereof. It is also possible that at least one component is surface mounted on a semi-flexible portion of such a component carrier.

The one or more components can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier and/or may be embedded in an interior thereof. Moreover, also other than the mentioned components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular, a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the at least one electrically insulating layer structure comprises at least one of the group consisting of resin (such as reinforced or non-reinforced resins, for instance epoxy resin or Bismale-imide-Triazine resin, more specifically FR-4 or FR-5), cyanate ester, polyphenylene derivate, glass (in particular glass fibers, multi-layer glass, glass-like materials), prepreg material, epoxy-based Build-Up Film, polytetrafluoroethylene (Teflon®), a ceramic, and a metal oxide. Teflon is a registered mark of The Chemours Company FC LLC of Wilmington, Del. U.S.A. Reinforcing materials such as webs, fibers or spheres, for example made of glass (multi-layer glass) may be used as well. Although prepreg or FR4 are usually preferred, other materials may be used as well. For high-frequency applications, high-frequency materials such as polytetrafluoroethylene, liquid crystal polymer and/ or cyanate ester resins may be implemented in the component carrier as electrically insulating layer structure.

In an embodiment, electrically conductive material of the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 1 illustrates a cross-sectional view of a component carrier according to an exemplary embodiment of the invention.

FIG. 2 illustrates a cross-sectional view of a component carrier according to another exemplary embodiment of the invention.

FIG. 3 illustrates a three-dimensional view of a component carrier according to still another exemplary embodiment of the invention.

DETAILED DESCRIPTION OF ILLUSTRATED EMBODIMENTS

Figure 4:
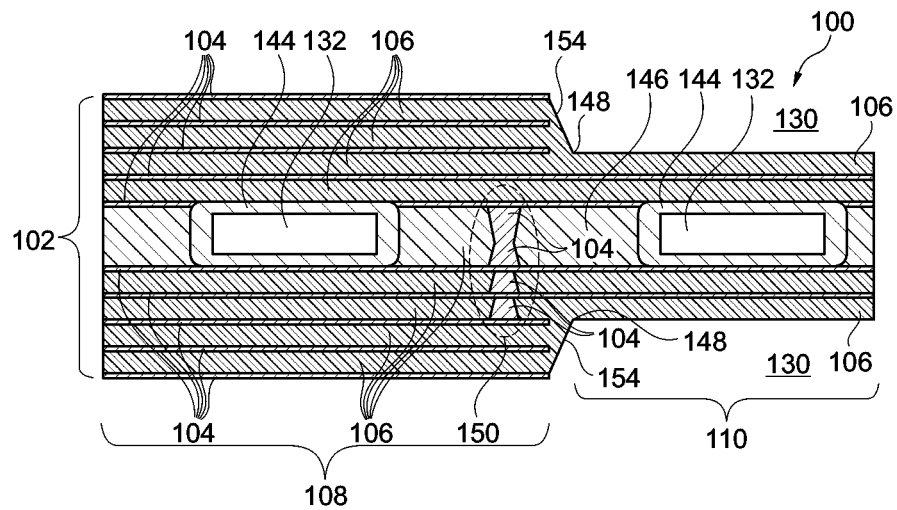
FIG. 4 illustrates a design of a component carrier according to a further exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a board-shaped embedded-component semi-flex component carrier may be provided in which an embedded component is surrounded by elastic low Young modulus material with a smaller value of the Young modulus and thus a higher elasticity than component-remote dielectric material in the rigid portion of the component carrier. Such dielectric material may be denoted as mechanical buffer material of a mechanical buffer structure, in view of its locally increased elasticity. In particular, an exemplary embodiment of the invention relates to the concept of creating a component carrier (such as a printed circuit board, PCB) utilizing a special grade of (in particular dielectric) materials that are appropriate for both component embedding and semi-flex applications on the same board.

In an embodiment, a material characteristic of said mechanical buffer structure may be defined as follows:

Young modulus smaller than 10 GPa, in particular smaller than 5 GPa, preferably smaller than 1 GPa CTE (coefficient of thermal expansion) value smaller than 150 ppm/K, in particular smaller than 100 ppm/K, preferably smaller than 70 ppm/K Elongation larger than 3%, in particular larger than 5%, preferably larger than 10%.

Exemplary embodiments of the invention may have a focus on semi-flex technology combined with embedding technology so provide a module type component carrier with high reliability.

FIG. 1 illustrates a cross-sectional view of a component carrier 100 according to an exemplary embodiment of the invention.

The semi-flex component carrier 100 comprises a vertically thicker rigid portion 108 integrally connected with a vertically thinner semi-flexible portion 110. The semi-flex component carrier 100 is here embodied as a printed circuit board (PCB) and comprises a laminated stack 102 composed of electrically conductive layer structures 104 and electrically insulating layer structures 106. The layer structures 104, 106 may be connected by lamination, i.e. the application of pressure and/or heat.

For example, the electrically conductive layer structures 104 may comprise patterned copper foils and vertical through connections, for example copper filled laser vias. The electrically insulating layer structure 106 may comprise a resin (such as epoxy resin) and reinforcing particles therein (for instance glass fibers or glass spheres). For instance, some of the electrically insulating layer structure 106 may be made of prepreg or FR4.

The electrically insulating layer structures 106 also comprise a cage-shaped or shell-shaped locally elastic mechanical buffer structure 144 selectively surrounding an embedded component 132 in the rigid portion 108. The mechanical buffer structure 144 may be an epoxy resin layer without glass fibers and with lower Young modulus (for instance below 1 GPa) and higher elongation (for instance above 5%) than the material of the remaining electrically insulating layer structures 106. As shown, said mechanical buffer structure 144 with low Young modulus and high elongation surrounds substantially the entire embedded component 132 (for instance a semiconductor chip), with the exception of contact vias 156 electrically contacting the component 132 with the electrically conductive layer structures 104. More specifically, the mechanical buffer structure 144 covers horizontal surface portions as well as vertical sidewalls of the component 132. The mechanical buffer structure 144 is shaped as a shell surrounding substantially the entire component 132, with the only exception of said one or more vias 156 contacting one or more pads (not shown) on a horizontal (in the shown embodiment lower) main surface of the component 132. Said mechanical buffer structure 144 encapsulates component 132 which is particularly prone to crack formation during bending of the semi-flex component carrier 100. Thus, configuring said mechanical buffer structure 144 from a low Young modulus and high elongation material, elongation stress may be suppressed most efficiently. Descriptively speaking, an elastic and ductile encapsulation of the component 132 embedded in the rigid portion 108 may reliably protect the sensitive semiconductor component 132 against damage when bending the semi-flex component carrier 100 about bending point 148. Apart from the selective individual change of the material composition directly around the component 132 by providing mechanical buffer structure 144, the rest of the stack 102 may be made of conventional and well available materials.

The semi-flexible portion 110 may have a horizontal length l of at least 1 mm, for instance 2 mm. With such a length value, proper bending around bending point 148 at an interface between rigid portion 108 and semi-flexible portion 110 may be possible without creating excessive bending load. In particular around component 132 embedded in the rigid portion 108, the risk of crack formation during bending of the semi-flexible portion 110 is particularly pronounced. However, in view of the low Young modulus and high elongation of the soft and elastic, more ductile than brittle, electrically insulating mechanical buffer structure 144, mechanical durability in particular in the surrounding of component 132 may be significantly improved.

More specifically, the semi-flex component carrier 100 according to FIG. 1 may comprise two exterior rigid portions 108 (only the left one is shown in FIG. 1), the central semi-flexible portion 110 and a cavity 130 delimiting the semi-flexible portion 110 from the rigid portions 108. In other words, the semi-flexible portion 110 is arranged between or is enclosed by different rigid portions 108. While the rigid portions 108 and the semi-flexible portion 110 comprise substantially the same materials (with the exception of the direct surrounding of component 132 being accomplished by the elastic mechanical buffer structure 144), the rigid portion 108 is rendered rigid by providing it with a larger vertical thickness than the semi-flexible portion 110. The latter is rendered flexible in view of its small thickness. As can be taken from FIG. 1 as well, the rigid portions 108 and the semi-flexible portion 110 share common continuous electrically insulating layer structures 106 and common (continuous or patterned) electrically conductive layer structures 104.

As shown, the semiconductor component 132 is embedded in one of the rigid portions 108 predominantly surrounded by the mechanical buffer structure 144 which has a lower Young modulus than other electrically insulating material of the remaining electrically insulating layer structures 106 the stack 102. Thereby, the embedded component 132 is properly protected from damage during bending, i.e. against bending stress. As shown, part of the mechanical buffer structure 144 and the entire component 132 is located in a core 146 of the stack 102. The core 146 is the vertically thickest electrically insulating layer structure 106 and is made of a fully cured material such as F4. Apart from its locally reduced value of the Young modulus (for instance below 5 GPa, preferably below 1 GPa), the mechanical buffer structure 144 also has a locally reduced elongation (in comparison with other electrically insulating material of the electrically insulating layer structures 106) and has a locally reduced coefficient of thermal expansion (again in comparison with other electrically insulating material of the electrically insulating layer structures 106). Preferably, said mechanical buffer structure 144 has an elongation of larger than 3% and more preferably of larger than 5%. The coefficient of thermal expansion of said mechanical buffer structure 144 is preferably less than 70 ppm/K. This combination of a high elasticity, a ductile character and a low CTE characteristic renders the mechanical buffer structure 144 highly appropriate for preventing the embedded component 132 from damage as a result of bending stress.

As can be taken from FIG. 1 as well, a vertical extension range L of the component 132 does not encompass a vertical level of the bending point 148 between the shown rigid portion 108 and the shown semi-flexible portion 110. Furthermore, a stress propagation inhibiting barrier 150 in form of a plurality of vertically stacked vias 152 filled with electrically conductive material such as copper in an interface region between the illustrated rigid region 108 and the illustrated flexible portion 110 inhibits stress propagation from the flexible portion 110 into the rigid region 108 and up to the component 132 during bending. Said measures, i.e. a vertical displacement of the component 132 with respect to the bending point 148 and the provision of a stress propagation inhibiting structure 150, additionally contribute to the reliable protection of the embedded component 132 from damage during bending.

FIG. 2 illustrates a cross-sectional view of a component carrier 100 according to another exemplary embodiment of the invention.

The embodiment of FIG. 2 differs from the embodiment of FIG. 1 in particular in that, according to FIG. 2, said mechanical buffer structure 144 extends from the shown rigid portion 108 up to and into the semi-flexible portion 110. Thus, an electrically insulating layer structure 106' made of the same material and being integrally formed with the mechanical buffer structure 144 is shared between an embedding area of the component 132 in the rigid portion 108 and the connected semi-flexible portion 110. It has turned out that taking this measure, i.e. extending the highly elastic and ductile character of the material of the mechanical buffer structure 144 up to the semi-flexible portion 110, prevents the entire component carrier 100 from damage during bending and promotes flexibility of the semi-flexible portion 100.

According to FIG. 2, the component 132 is embedded between top electrically insulating layer structure 106' and a bottom electrically insulating layer structure 106 as well as within a further electrically insulating layer structure 106 in the form of core 146, wherein all three electrically insulating layer structures 106, 106' extend up to and along the entire semi-flexible portion 110.

Furthermore, the component carrier 100 according to FIG. 2 has two cavities 130 and correspondingly two bending points 148 in above and below the semi-flexible portion 110.

FIG. 3 illustrates a three-dimensional view of a semi-flex component carrier 100 according to still another exemplary embodiment of the invention. According to FIG. 3, the semi-flexible portion 110 is bent about a freely definable bending angle β in a range between 0° in 180°, in the present embodiment approximately 90°. While being conventionally prone to damage during bending, encapsulating each of the shown embedded components 132 in an elastic material of a mechanical buffer structure 144 reliably prevents the components 132 from damage during bending.

FIG. 4 illustrates a cross-sectional view of a semi-flex component carrier 100 according to still another exemplary embodiment of the invention.

In the embodiment of FIG. 4, the semi-flexible portion 110 is formed as a central portion of the stack 102. The full thickness portion of the stack 102 constitutes the rigid portion 108. Material of the stack 102 is removed from both opposing main surfaces in the semi-flexible portion 110 so that two cavities 130 at opposing main surfaces of the component carrier 100 are formed, thereby delimiting the semi-flexible portion 110.

Highly advantageously, it is possible to embed one or more components 132 (such as semiconductor chips) in the semi-flex component carrier 100. In the shown embodiment, one component 132 is embedded in a central core 146 of the rigid portion 108. Another component 132 is embedded in the central core 146 in the semi-flexible portion 110. Each of said components 132 is encapsulated with in an elastic material of a mechanical buffer structure 144, as described above.

As shown in FIG. 4, a transition region between the semi-flexible portion 110 and the rigid portion 108 has a slanted sidewall 154, both at the top side and on a bottom side. This further contributes to the protection of the component carrier 100 against damage during bending.

Figure 5:
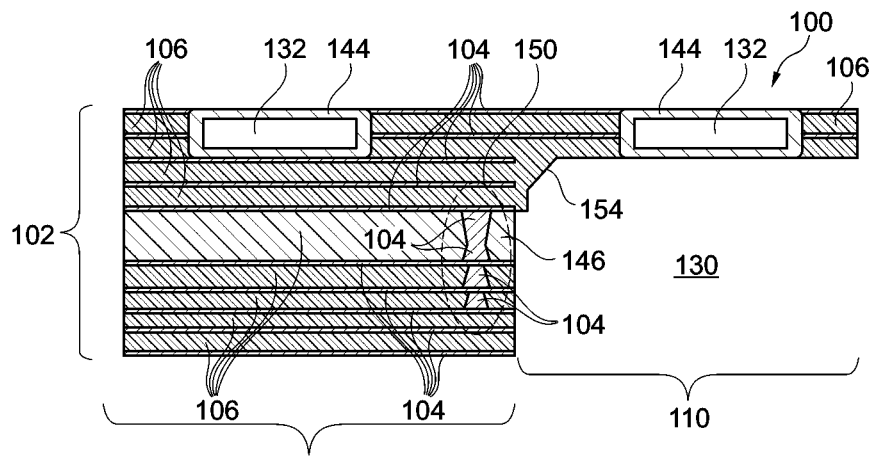
FIG. 5 illustrates a cross-sectional view of a component carrier according to still another exemplary embodiment of the invention.

FIG. 5 illustrates a cross-sectional view of a semi-flex component carrier 100 according to yet another exemplary embodiment of the invention.

The semi-flex component 100 shown in FIG. 5 corresponds to the architecture described above, but has components 132 embedded in both the rigid portion 108 and the semi-flexible portion 110 which extend up to an upper main surface of the component carrier 100. Each of said components 132 is embedded in an assigned shell of elastic dielectric material constituted by a respective mechanical buffer structure 144 having the above-described properties.

It has turned out surprisingly that the embedding of a respective component 132 in a semi-flexible portion 110 encapsulated by a mechanical buffer structure 144 with low Young modulus and high elongation has no significant negative impact on the bendability and on the risk of crack formation in the semi-flexible portion 110.

As shown in FIG. 5, a transition region between the semi-flexible portion 110 and the rigid portion 108 has a slanted sidewall 154 at the top side.

Figure 6:
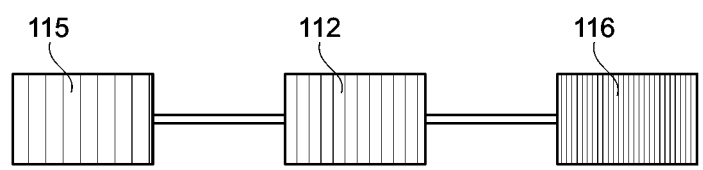
FIG. 6 illustrates a polymer with different functional sections used according to an exemplary embodiment of the invention.

FIG. 6 illustrates schematically a polymer with different functional sections 112, 115, 116 which may be used for forming the electrically mechanical buffer structure 144 and/or electrically insulating layer structure 106' according to an exemplary embodiment of the invention.

The illustrated polymer has a central flexible segment 112 between a reactive segment 115 on one side and a hard segment 116 on the opposing other side. The hard segment 116 may be configured to have a high temperature resistance. The flexible segment 112 promotes low warpage and serves for a relaxation on internal stress. The reactive segment 115 may be configured for reacting with epoxy resin to thereby form larger compounds.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A semi-flex component carrier, comprising:
a stack comprising at least one electrically insulating layer structure and at least one electrically conductive layer structure, wherein the stack defines at least one rigid portion and at least one semi-flexible portion; and
a component embedded in the at least one rigid portion;
wherein at least one electrically insulating layer structure of the stack comprises a mechanical buffer structure surrounding at least part of the component and having a lower value of the Young modulus than other electrically insulating material of the stack,
wherein the mechanical buffer structure comprises a polymer having a flexible segment between a reactive segment and a hard segment.

2. The component carrier according to claim 1, wherein at least one of the component and at least part of said mechanical buffer structure is located in a core of the stack.

3. The component carrier according to claim 1, comprising one of the following features:
wherein said mechanical buffer structure extends exclusively within the at least one rigid portion;
wherein said mechanical buffer structure belongs to and is made of the same material as an electrically insulating layer structure which extends from the at least one rigid portion up to the at least one semi-flexible portion.

4. The component carrier according to claim 1, wherein the Young modulus of said mechanical buffer structure is smaller than 10 GPa.

5. The component carrier according to claim 1, wherein a coefficient of thermal expansion of said mechanical buffer structure is less than 150 ppm/K.

6. The component carrier according to claim 1, wherein said mechanical buffer structure has an elongation of larger than 3%.

7. The component carrier according to claim 1, wherein a vertical extension range of the component does not encompass a vertical level of one or more bending points between the at least one rigid portion and the at least one semi-flexible portion.

8. The component carrier according to claim 1, further comprising:
a stress propagation inhibiting barrier in an interface region between the at least one rigid portion and the at least one semi-flexible portion and configured for inhibiting stress propagation from the at least one semi-flexible portion to the component.

9. The component carrier according to claim 1, wherein the at least one semi-flexible portion has a smaller number of layer structures than the at least one rigid portion so that at least one layer structure of the at least one rigid portion is missing in the at least one semi-flexible portion on a top side or on a bottom side of the stack to thereby form one or two cavities in the stack.

10. The component carrier according to claim 1, wherein a transition region between the at least one semi-flexible portion and the at least one rigid portion has a slanted sidewall.

11. The component carrier according to claim 1, wherein the at least one electrically insulating layer structure is shared between an embedding area surrounding the component and the at least one semi-flexible portion.

12. The component carrier according to claim 1, wherein a density of vertical through-connections surrounding the embedded component is at least 10 vias in a volume surrounding the component having dimensions of 20 mm in all three spatial directions.

13. The component carrier according to claim 1, wherein the component is embedded between a top electrically insulating layer structure and a bottom electrically insulating layer structure as well as within a further electrically insulating layer structure, wherein all three electrically insulating layer structures extend into the at least one semi-flexible portion.

14. The component carrier according to claim 1, wherein the mechanical buffer structure comprises or consists of a resin.

15. The component carrier according to claim 1, wherein the mechanical buffer structure comprises or consists of epoxy derivatives.

16. The component carrier according to claim 1, wherein the mechanical buffer structure is free of glass cloth.

17. The component carrier according to claim 1, wherein all of the layer structures of the at least one semi-flexible portion also extend along the at least one rigid portion, wherein said layer structures are made of the same material or have the same thickness in the at least one semi-flexible portion and in the at least one rigid portion.

18. The component carrier according to claim 1, wherein the component is exclusively directly surrounded by the mechanical buffer structure and by one or more contact vias electrically contacting the component with the at least one electrically conductive layer structure.

19. The component carrier according to claim 1, wherein the component carrier has one semi-flexible portion between two opposing rigid portions.

20. The component carrier according to claim 1, comprising at least one of the following features:
wherein the hard segment has a high temperature resistance;
wherein the flexible segment shows low warpage and relaxation on internal stress;
wherein the reactive segment is configured for reacting with epoxy resin.

21. The component carrier according to claim 1, wherein the at least one electrically insulating layer structure being different from the mechanical buffer structure comprises at least one of the following features:
said at least one electrically insulating layer structure has a value of the Young modulus of more than 20 GPa;
said at least one electrically insulating layer structure is made of prepreg or FR4;
said at least one electrically insulating layer structure has an elongation in a range from 1% to 2%.

22. The component carrier according to claim 1, wherein the mechanical buffer structure surrounding at least part of the component covers one or more horizontal surface portions or more vertical sidewalls of the component.

23. The component carrier according to claim 1, comprising at least one of the following features:
wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein the at least one electrically conductive layer structure comprises at least one of the group consisting of copper, aluminum, nickel, silver, gold, palladium, and tungsten;
wherein the at least one electrically insulating layer structure comprises at least one of the group consisting of reinforced or non-reinforced resin, FR-4, FR-5, cyanate ester, polyphenylene derivate, glass, prepreg material, epoxy-based Build-Up Film, polytetrafluoroethylene, a ceramic, and a metal oxide;
wherein the component carrier is shaped as a plate;
wherein the component carrier is configured as one of the group consisting of a printed circuit board, and a substrate;
wherein the component carrier is configured as a laminate-type component carrier.

24. A method of manufacturing a semi-flex component carrier, the method comprising:
providing a stack comprising at least one electrically insulating layer structure and/or at least one electrically conductive layer structure, wherein the stack defines at least one rigid portion and at least one semi-flexible portion;
embedding a component in the at least one rigid portion;
wherein at least one electrically insulating layer structure of the stack comprises a mechanical buffer structure surrounding at least part of the component and having a lower value of the Young modulus than other electrically insulating material of the stack,
wherein the mechanical buffer structure comprises a polymer having a flexible segment between a reactive segment and a hard segment.

25. A semi-flex component carrier, comprising:
a stack comprising at least one electrically insulating layer structure and at least one electrically conductive layer structure, wherein the stack defines at least one rigid portion and at least one semi-flexible portion; and
a component embedded in the at least one rigid portion;
wherein at least one electrically insulating layer structure of the stack comprises a mechanical buffer structure surrounding at least part of the component and having a lower value of the Young modulus than other electrically insulating material of the stack,
wherein a polymer having a flexible segment between a reactive segment and a hard segment is used for forming at least one of the mechanical buffer structure and said at least one electrically insulating layer structure.

* * * * *